(12) United States Patent
Obara et al.

(10) Patent No.: US 6,308,772 B1
(45) Date of Patent: Oct. 30, 2001

(54) HEAT SINK

(75) Inventors: Rikuro Obara; Kaoru Matsumoto, both of Miyota-machi (JP)

(73) Assignee: Minebea Co., Ltd., Nagano-ken (JP)

( * ) Notice: Subject to any disclaimer, the term of this patent is extended or adjusted under 35 U.S.C. 154(b) by 0 days.

(21) Appl. No.: 09/328,367

(22) Filed: Jun. 9, 1999

(30) Foreign Application Priority Data

Jun. 9, 1998 (JP) .................................................. 10-159771

(51) Int. Cl.⁷ ........................................................ H05K 7/20
(52) U.S. Cl. .................. 165/80.3; 165/185; 174/16.3; 257/718; 257/722; 361/704
(58) Field of Search .................... 165/80.3, 185; 174/16.3; 257/718, 722, 719; 361/704, 703, 692

(56) References Cited

U.S. PATENT DOCUMENTS

| | | | |
|---|---|---|---|
| 2,965,819 | * 12/1960 | Rosenbaum | 257/722 |
| 2,984,457 | * 5/1961 | Wulc | 165/185 X |
| 3,187,812 | * 6/1965 | Staver | 165/80.3 X |
| 3,670,215 | * 6/1972 | Wilkens et al. | 257/718 |
| 3,694,703 | * 9/1972 | Wilens et al. | 257/718 |
| 4,356,864 | * 11/1982 | Ariga et al. | 165/80.3 |
| 4,605,058 | * 8/1986 | Wilens | 257/718 X |
| 4,712,159 | * 12/1987 | Clemens | 165/80.3 X |

FOREIGN PATENT DOCUMENTS

| | | | |
|---|---|---|---|
| 2013539 | * 10/1971 | (DE) | 174/16.3 |
| 632686 | * 1/1995 | (EP) | 165/80.3 |
| 53-89371 | * 8/1978 | (JP) | 165/185 |
| 57-102060 | * 6/1982 | (JP) | 257/722 |
| 5-13629 | * 1/1993 | (JP) | 257/718 |

\* cited by examiner

Primary Examiner—Leonard Leo
(74) Attorney, Agent, or Firm—Staas & Halsey LLP

(57) ABSTRACT

A heat sink provided with a heat conducting section 8 having a heat absorbing surface in contact with the heat emitting component, and fins 10 formed by being projected from the said heat conducting section 8, said fins 10 having air holes 11, and heat conducting section 8 being provided with clamps 7 for fixing to the heat emitting component.

8 Claims, 7 Drawing Sheets

HEAT SINK

BACKGROUND OF THE INVENTION

1. Field of the Invention

The present invention provides a heat sink structure, especially suitable for dissipating heat from semiconductor equipment such as CPUs.

2. Description of the Prior Art

In semiconductor devices such as very large scale integrated circuits, some of the applied electrical power is consumed by the operation of the semiconductor device, but the surplus is emitted as heat from the outside of the device. Since, in integrated circuits, the semiconductors are concentrated in a small area, the generated heat is concentrated at certain points and temperatures will rise at certain parts of the devices. In equipment using CPUs and MPUs, etc., the thermal performance especially affects the reliability and life of these elements. Recently, both the density of integration of CPUs and MPUs, etc. and their processing speed have been increasing rapidly, and this has been accompanied by an increase in the amount of heat generated. To avoid the problems associated with this, it is normal to provide a heat sink for the heat emitting component which dissipates the heat over a wider area and thus prevents the temperature from rising excessively. If the heat dissipation is not sufficient, it's effectiveness is increased by adding fins.

FIG. 8 is a cross sectional diagram showing a conventional heat sink mounted on a CPU or similar semiconductor device. As shown by FIG. 8, a heat radiating plate 53 is arranged on the semiconductor device 51 (CPU, MPU or similar) which is mounted on the surface of wiring board 50, with foil contact sheet 54 arranged between them in order to improve the thermal conductivity. This heat radiating plate 53 is fixed to wiring board 50 using a method such as soldering. The heat sink 55 is arranged on top of that radiating plate 53, where the said heat sink 55 and the radiating plate 53 are separated by the foil contact sheet 54, from each other. The heat radiating plate 53 and the heat sink 55 are securely attached to each other on the thread area 56 raising from the heat radiating plate 53, by fastening with nuts 57, to dissipate the heat and cool the equipment. The foil contact sheets are used to improve the contact between the LSI element and the heat radiating plate, and between the heat radiating plate and the heat sink, but in order to improve the thermal conductivity, the connecting surfaces are often coated with a thermally conductive coating of silicon resin.

Conventionally, this type of heat sink structure 55 was formed by die casting etc. out of aluminum or aluminum alloy or other material having good thermal conductivity, and the fins 58 could be formed by machining and cutting. However, as described above, the increasing chip density and processing speed of electronic components is accompanied by increased generation of heat, and so it is necessary to increase the thermal radiation efficiency of heat sink 55, but unfortunately there is a limit to the amount by which the surface area of fins 58, which act to dissipate the heat of this type of heat sink, can be increased. Also, this structure uses nuts, etc., to mount the heat sink on the LSI element, and said nuts must be tightened or loosened individually when mounting and removing the structure, which creates a requirement for extra labor.

SUMMARY OF THE INVENTION

In order to overcome the above problems, the present invention provides a heat sink with improved radiation efficiency and which is easy to mount and dismount on LSI and similar elements.

In order to overcome the above-mentioned problem, main present invention provides a heat sink, having a heat conducting section which absorbs and transfers the heat generated by the heat emitting component to which it is connected, and, connected to said heat conducting section, heat dissipating fins which dissipate the heat transferred from the heat conducting section into the ambient air, this heat sink comprising a heat conducting section having a heat absorbing surface connected to the heat emitting component, and a fin section, formed by projecting the surface of said heat conducting section into fins which are integral with the said heat conducting section.

The second present invention provides a heat sink according to the main present invention, having the characteristic that said fins are projected from the heat conducting section in a bag shape (having only one end open).

The third present invention provides a heat sink according to the main present invention, having the characteristic that through holes are made in said fins to allow cooling air to pass.

The fourth present invention provides a heat sink according to the main present invention or third invention, having the characteristic that said fins project vertically and in parallel from the heat conducting section and that multiple fins are arranged in a row.

The fifth present invention provides a heat sink according to the main present invention or the fourth invention, having the characteristic that clamps are provided for the heat conducting section, either as clamps provided directly on the heat emitting component or as clamps mounted on a radiating section attached to the heat emitting component.

The sixth present invention provides a heat sink according to the fifth invention, having the characteristic that the said clamps are arranged on a mounting panel provided between the said heat conducting section and the heat emitting component.

The seventh present invention provides a heat sink according to the main invention or the fourth invention, having the characteristic that the said clamps, used to clamp together the heat conducting section and the heat emitting component, are provided as a separate component from the said heat conducting section.

The eighth present invention provides a heat sink according to main invention or the seventh invention, having the characteristic that the surfaces of the said heat conducting section and fins are painted black.

DESCRIPTION OF THE PREFERRED EMBODIMENTS

Figure 1:
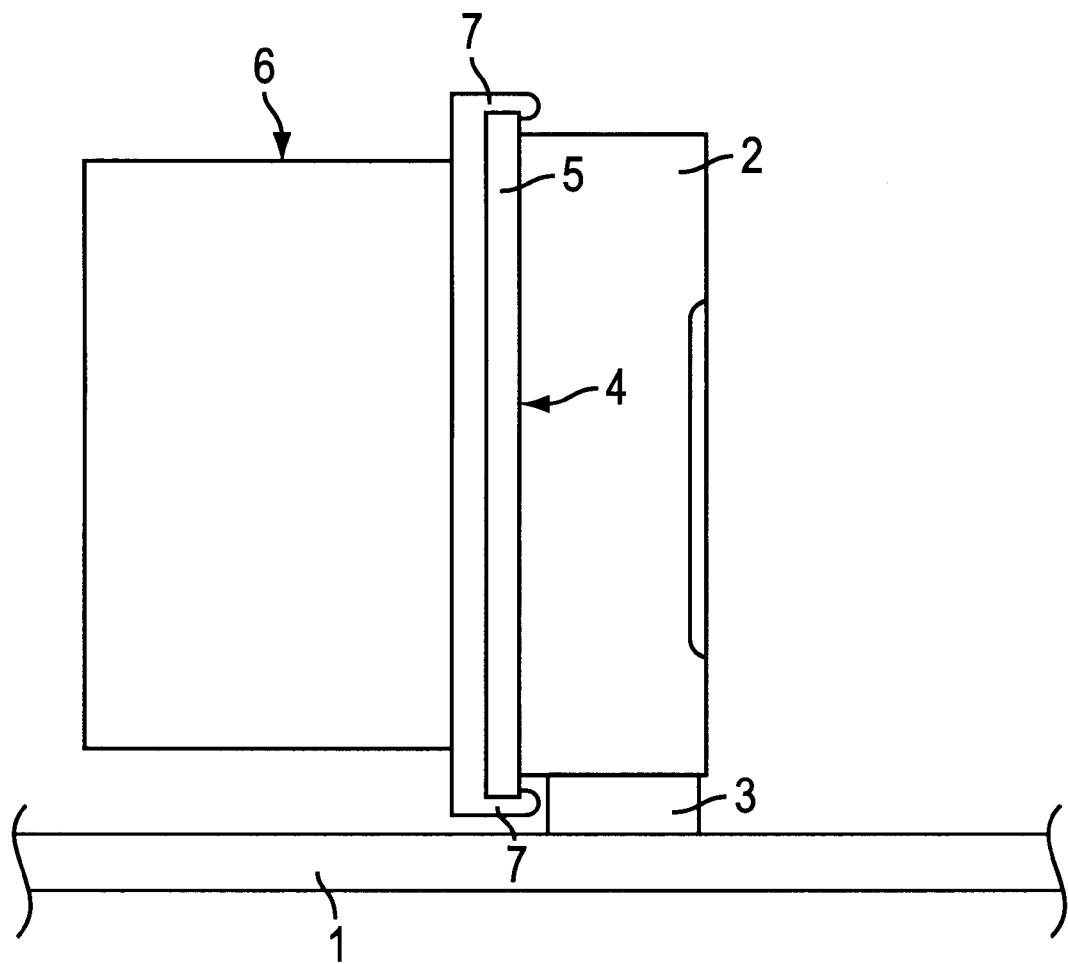
FIG. 1 is a side view of a CPU package comprising 2 ultra-LSI CPU's arranged side by side inside a long, narrow case to which is attached a heat sink in the shape provided by the present invention.
Figure 2:
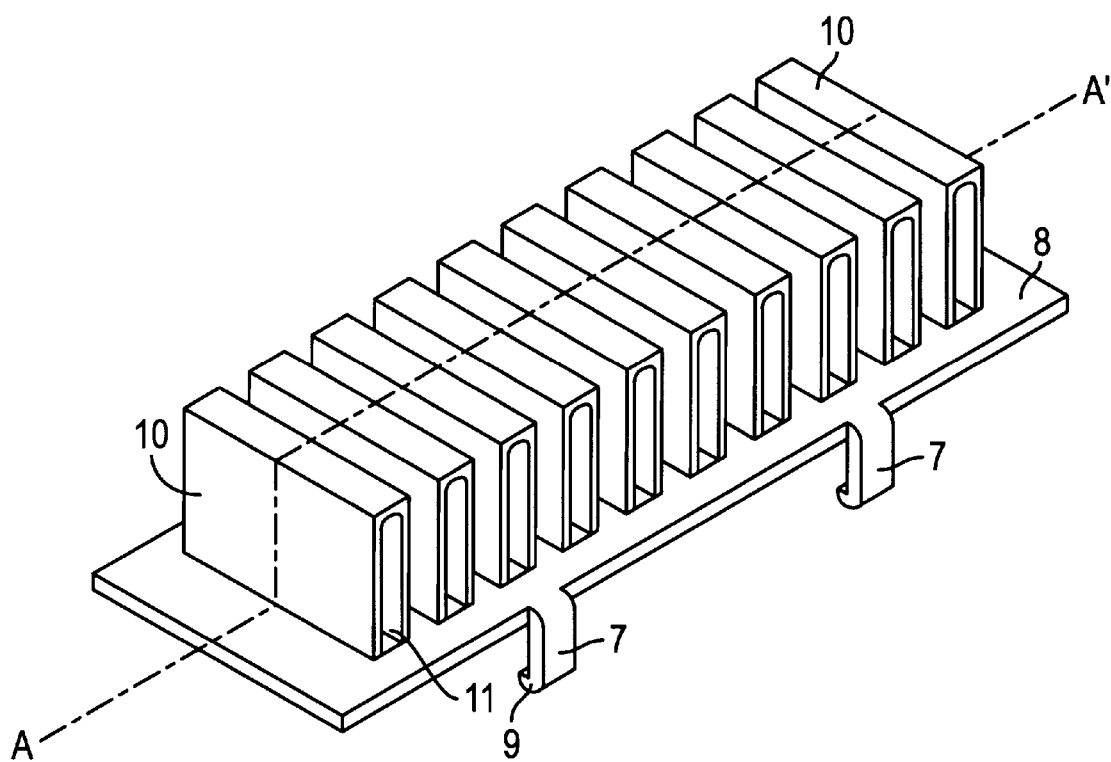
FIG. 2 is a perspective view of the heat sink.
Figure 3:
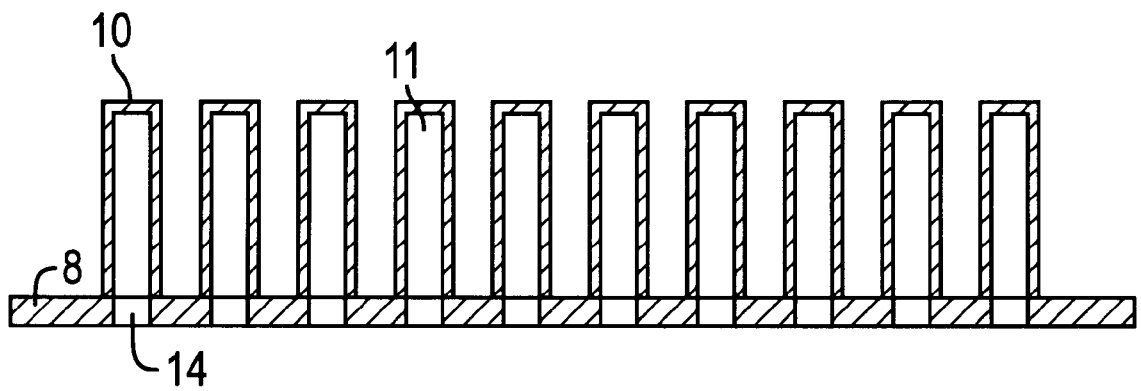
FIG. 3 is a cross sectional view along the line A–A' of FIG. 2.
Figure 4:
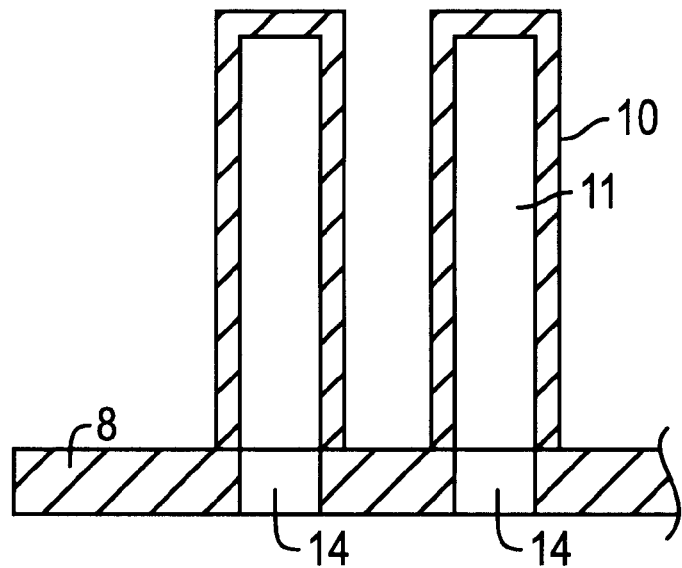
FIG. 4 is a partial cross sectional view of FIG. 3.

The first embodiment of the present invention will be described with reference to the explanatory diagrams. FIG. 1 is a side view of a CPU package comprising 2 ultra-LSI CPUs arranged side by side inside a long, narrow case to which is attached a heat sink in the form provided by the present invention. FIG. 2 is a perspective view of the heat sink, FIG. 3 is a cross sectional view along the line A–A' of FIG. 2, and FIG. 4 is a partial cross sectional view of FIG. 3.

In FIG. 1, numeral 1 refers to the wiring board comprising the mother board of a computer. Socket 3 is affixed to said wiring board 1 so as to allow CPU package 2 to be freely mounted and unmounted. CPU package 2 consists of two ultra LSI chips arranged side by side in a long, narrow rectangular case. The heat radiating section, arranged on the upper surfaces of the LSIs, is shown in FIG. 1 as the left side wall 4.

Firmly bonded to side wall 4 of said CPU package 2 is one side of heat conducting plate 5, which has a width slightly greater than that of side wall 4. On the other side of heat conducting plate 5 is arranged the heat sink 6 of the present invention, which is mounted in place by clamps 7 which grip the rim of heat conducting plate 5.

Heat sink 6, as shown in FIG. 2, has a flat base member 8, from the sides of which descend the said clamps 7. The lower surface of base member 8 is in contact with and absorbs heat from heat conducting plate 5, which transfers heat from the heat generating source. Claws 9 on the ends of clamps 7 act to grip heat conducting plate 5 and clamp it to base member 8. Heat sink 6 is formed from aluminum which has good thermal conductivity and is highly malleable. Fins 10 are formed by a drawing or stamping process by which sections of one surface of base member 8 are projected out to form multiple fins, arranged in parallel. Air holes 11 are arranged in the sides of each fin 10 to allow the passage of cooling air.

As can be seen from FIGS 3 and 4, fins 10 are formed by causing parts of one surface of base member 8 to project outwards. Fins 10 are therefore an integral part of base member 8, and because of the drawing process applied to them, fins 10 have less thickness than base member 8.

Figure 5:
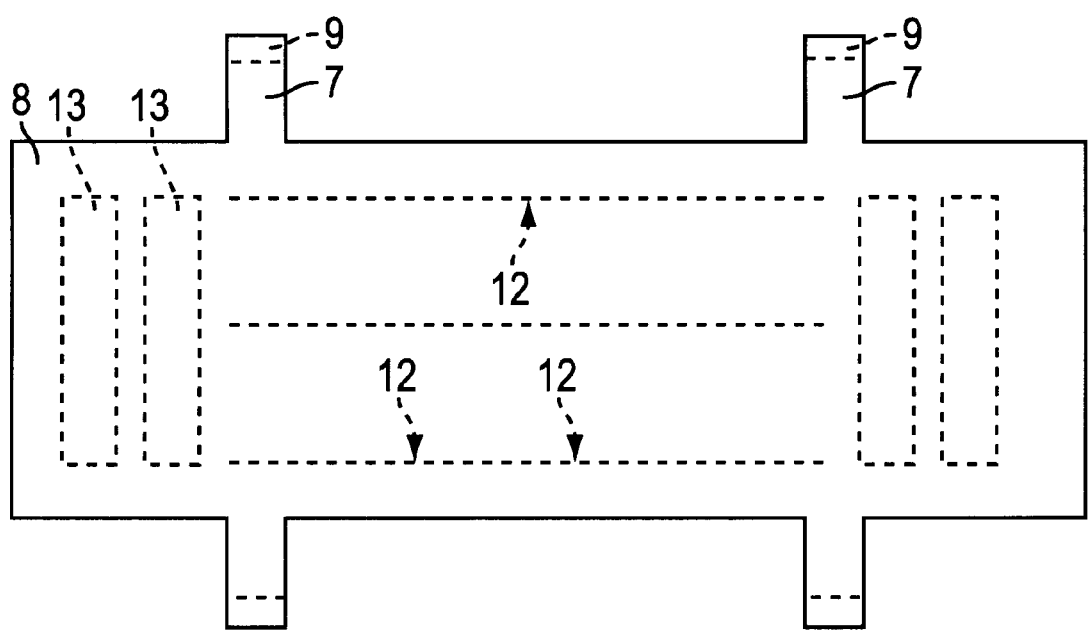
FIG. 5 is a front view of the of the base member in a partially processed state.

Normally, the bag-shaped fins will be formed by applying pressure to a metal plate via a die. When used as a heat sink for a device which generates little heat, it is no impediment if the fins 10 do not have air holes. However, by adding air holes to fins 10, the surface area in contact with passing air is doubled and the radiation efficiency is greatly increases The air holes 11 in fins 10 can be formed by first using a die to project the fins without holes, and then employ a separate process to cut away the sides of the fins 10 to provide them with air holes 11. However, the need for an extra cutting process increases the work required to make the heat sink and therefore increases the cost of manufacture. To avoid this, the air holes can be formed at the same time as the fins by first preparing the metal plate used to make base member 8 as shown in FIG. 5. Slots 12 are cut in the plate, and then when a die is used to press out the sections shown by dotted lines 13, the fins 10 will be formed with air holes already present.

Further, if it is possible to establish an air route to the heat radiating surface of the CPU package 2, then, as shown in FIGS. 3 and 4, the through holes 14 formed in base member 8 can be used to allow hot air to pass from under the heat sink to above, or or cooling air to pass in the opposite direction.

Figure 6:
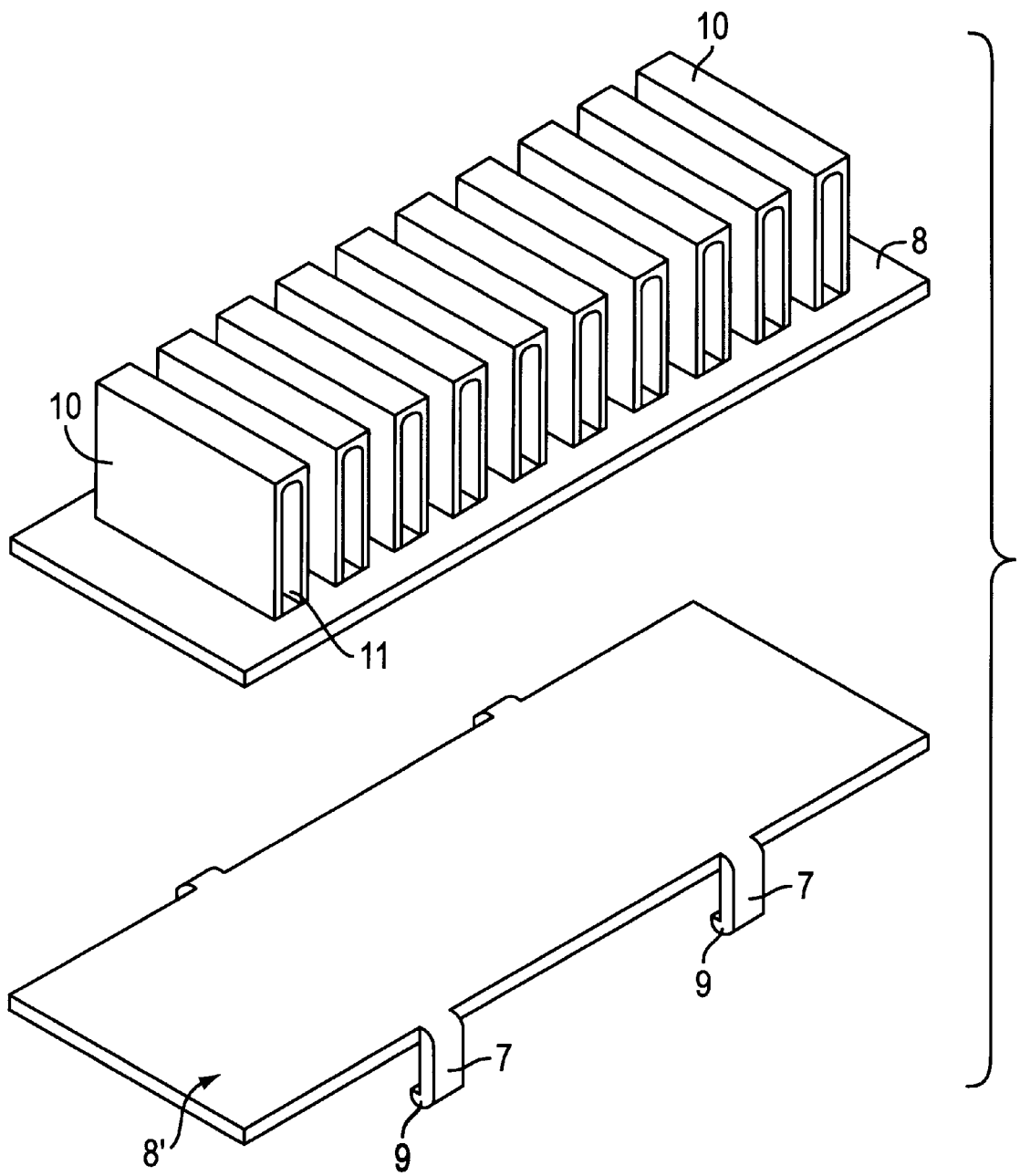
FIG. 6 is an exploded perspective view showing the 2nd embodiment of the present invention.

In the embodiment described above, clamps 7 having clamp claws 9 are formed on the sides of the base member 8 which has fins 10. Normally the material used for making base member 8 will be aluminum because it is processed easily. Furthermore, in experimental work, etc. where the CPU package 2 is removed from the mother board, the heat sink has to be detached from the CPU package 2 quite often. Aluminum has good malleability, but it is not very elastic and is easily bent out of shape. This means that frequent dismounting and remounting of the heat sink is likely to damage the clamp claws 9. FIG. 6 shows a further embodiment of the present invention which is intended to remove this drawback. In this embodiment, clamps 7 are not formed on base member 8, but are instead formed on a separate mounting panel 8, made of a metal such as phosphor bronze, which has both good heat conductivity and good elasticity. Clamps 7 with claws 9 are formed on the sides of said mounting panel 8' in one piece. Base member 8 and mounting panel 8 are attached to one another using a suitable method to ensure good heat conduction such as spot welding or a conductive adhesive. In the use of this embodiment for cases where the temperature of the heat sink will rise greatly during operation, and where the thermal expansion coefficients of the base member 8 and mounting panel 8 are very different, it is necessary to take into account the bimetal effect.

Figure 7:
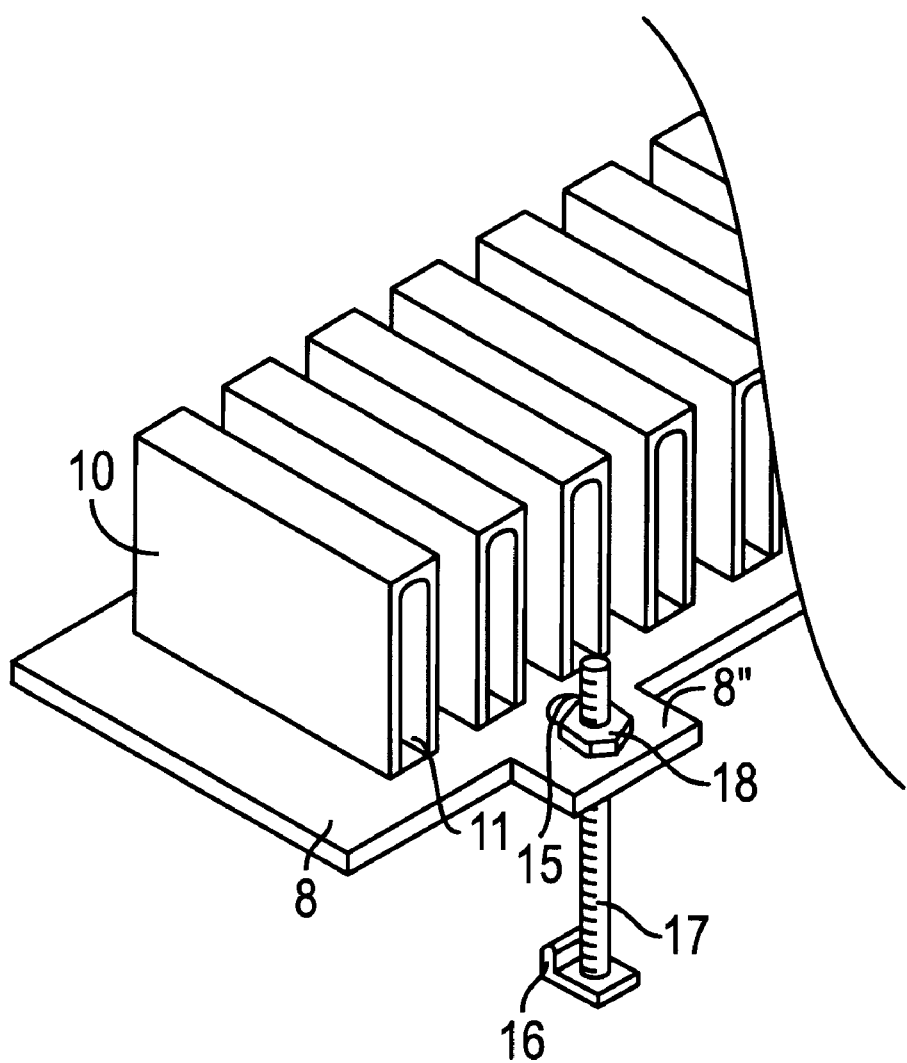
FIG. 7 is a perspective view showing another embodiment of the clamping section.
Figure 8:
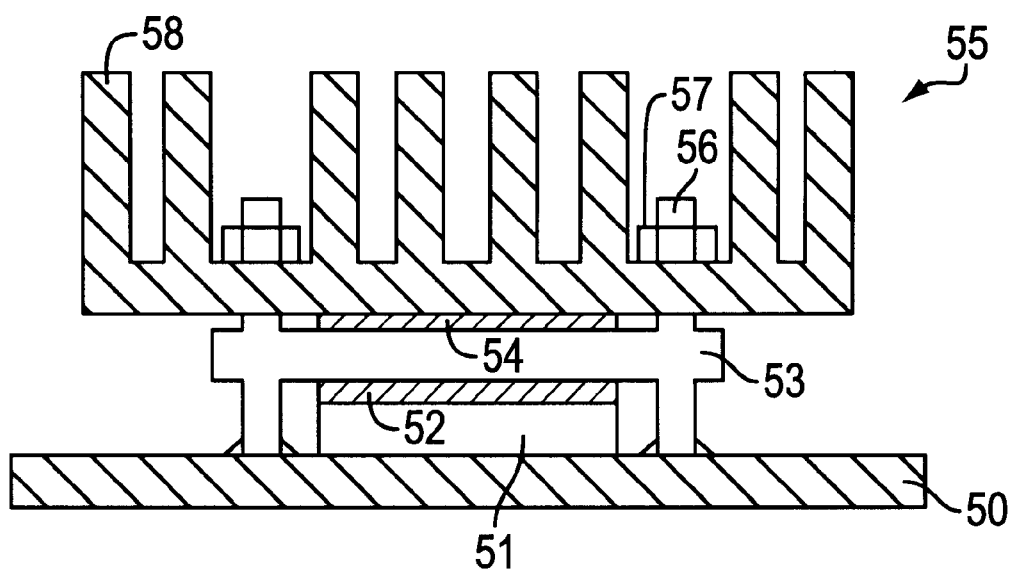
FIG. 8 is a cross sectional view showing a conventional heat sink.

In the embodiment described above, the heat sink is mounted on the CPU package 2, and said package has a fixed thickness so the length of clamps 7 can also be fixed. However, in cases where the thickness of ultra-LSI packages varies, it is not possible to use a heat sink with the same dimensions for its clamps. In this case, as shown in FIG. 7, flanges 8" are formed on the sides of base member 8, said flanges containing long, thin slits 15. Fixing screws 17, to the head of which are attached clamp claws 16, pass through said slits 15 and are secured by nuts 18. After clamp claws 16 are attached to the semiconductor device case, by tightening nuts 18 the heat sink can be firmly secured to the semiconductor device. This kind of structure allows the heat sink to be easily mounted on packages of varying thicknesses, and the slits in flanges 8" allow the position of the fixing screws to be adjusted so that the heat sink may be easily mounted on packages of different widths.

The present invention has been described in terms of the above embodiment where clamps are provided at 4 locations around the edges of a base member, but it is not restricted to this and is also applicable to structures having a base member with clamps around its edges in different shapes and numbers to those described above. Also, FIG. 1 shows the heat sink directly clamped to the heat conducting plate 5 by clamps 7. FIG. 1 does not show a foil contact sheet between the heat sink and the heat conducting plate, but such a foil contact sheet may be inserted in this position in order to improve the connection. Within the range of the gist of this invention various embodiments are possible, and such embodiments are not excluded from the scope of the present invention.

The invention described by the main present invention provides a heat sink in which a drawing process is applied to one surface of a base member of the heat sink to form a plurality of fins projecting from one side of said base member, said fins being formed so that air can circulate past both the inner and the outer surfaces of the fins in order to improve the thermal radiation efficiency of the heat sink, with the result that the heat sink can improve the life and reliability of LSI elements. Furthermore, a plurality of clamps are provided around the edges of the base member of the heat sink for clamping it to the LSI element, thus improving workability by making it easier to mount and dismount the heat sink.

The second invention provides a heat sink in which the fins are formed as projections from the heat conducting section which are manufactured using a drawing process only, so that manufacturing is simplified and manufacturing costs are low.

The third invention provides through holes in the above mentioned fins to allow the passage of cooling air, and by this means the radiating surface is increased, allowing more efficient thermal radiation.

The fourth invention provides a plurality of fins aligned in parallel and projecting vertically from the heat conducting section, thus allowing many fins to be mounted on a narrow heat conducting plate and allowing more efficient thermal radiation.

The fifth invention provides clamps on the heat conducting section for clamping it either directly to the heat emitting component or to a heat radiating section affixed to the heat emitting component, thus eliminating the need for a separate means of fixing such as fixing screws, and making it simple to mount and dismount the heat sink on the heat emitting component with the result that the structure is simplified and manufacturing costs are lowered.

The sixth invention provides a mounting panel fitted between the heat conducting section and the heat emitting component, where the clamps are formed as part of this mounting panel, thus allowing the clamps to be made from strong, flexible material and making it easier to form the heat conducting section, including the fins.

The seventh invention provides a clamping means where the clamps are separate from the heat conducting section, thus making it easy to mount the heat sink on heat emitting components of various thicknesses.

The eighth invention provides a heat conducting section and fins as described above which are coated with black paint, thus increasing their thermal radiation effectiveness. Although a few preferred embodiments of the present invention have been shown and described, it would be appreciated by those skilled in the art that changes may be made in this embodiment without departing from the principles and spirit of the invention, the scope of which is defined in the claims and their equivalents.

What we claimed is:

1. A heat sink which absorbs and transfers heat generated by a heat emitting component and dissipates the heat transferred from the heat emitting component into the ambient air comprising:

a heat conducting section having a heat absorbing surface connected to the heat emitting component; and bag shaped heat radiating fins arranged in a row, said bag shaped heat radiating fins being formed using a drawing process to project vertically and parallel to a surface of said heat conducting section, and integral to said heat conducting section, wherein
      clamps are provided for the heat conducting section, and are arranged on a mounting panel provided between said heat conducting section and the heat emitting component.

2. A heat sink according to claim 1, wherein the surfaces of said heat conducting section and fins are painted black.

3. A heat sink which absorbs and transfers heat generated by a heat emitting component and dissipates the heat transferred from the heat emitting component into the ambient air comprising:

a heat conducting section having a heat absorbing surface connected to the heat emitting component; and bag shaped heat radiating fins arranged in a row, said bag shaped heat radiating fins being formed using a drawing process to project vertically and parallel to a surface of said heat conducting section, and integral to said heat conducting section, wherein clamps, used to clamp together the heat conducting section and the heat emitting component, are provided as a separate component from said heat conducting section.

4. A heat sink according to claim 3, wherein the surfaces of said heat conducting section and fins are painted black.

5. A heat sink which absorbs and transfers heat generated by a heat emitting component and dissipates the heat transferred from the heat emitting component into the ambient air comprising:

a heat conducting section having a heat absorbing surface connected to the heat emitting component; and bag shaped heat radiating fins arranged in a row, said bag shaped heat radiating fins being formed using a drawing process to project vertically and parallel to a surface of said heat conducting section, and integral to said heat conducting section, wherein
      through holes are made in said fins to allow the passage of cooling air,
      clamps are provided for the heat conducting section, and are arranged on a mounting panel provided between said heat conducting section and the heat emitting component.

6. A heat sink according to claim 5, wherein the surfaces of said heat conducting section and fins are painted black.

7. A heat sink which absorbs and transfers heat generated by a heat emitting component and dissipates the heat transferred from the heat emitting component into the ambient air comprising:

a heat conducting section having a heat absorbing surface connected to the heat emitting component; and bag shaped heat radiating fins arranged in a row, said bag shaped heat radiating fins being formed using a drawing process to project vertically and parallel to a surface of said heat conducting section, and integral to said heat conducting section, wherein
      through holes are made in said fins to allow the passage of cooling air, and
      clamps, used to clamp together the heat conducting section and the heat emitting component, are provided as a separate component from said heat conducting section.

8. A heat sink according to claim 7, wherein the surfaces of said heat conducting section and fins are painted black.

* * * * *

UNITED STATES PATENT AND TRADEMARK OFFICE
CERTIFICATE OF CORRECTION

PATENT NO. : 6,308,772 B1
DATED : October 30, 2001
INVENTOR(S) : Rikuro Obara et al.

It is certified that error appears in the above-identified patent and that said Letters Patent is hereby corrected as shown below:

Column 4,
Line 19, change "8" to -- 8' --.
Line 23, change "8" to -- 8' --.
Line 28, change "8" to -- 8' --.

Column 5,
Line 44, "Although" begins a new paragraph.

Signed and Sealed this

Twenty-third Day of July, 2002

Attest:

Attesting Officer

JAMES E. ROGAN
Director of the United States Patent and Trademark Office